(12) United States Patent
Hallman et al.

(10) Patent No.: US 12,255,002 B2
(45) Date of Patent: Mar. 18, 2025

(54) HIGH CURRENT SURFACE MOUNT TOROID INDUCTOR

(71) Applicant: Steering Solutions IP Holding Corporation, Saginaw, MI (US)

(72) Inventors: Michael C. Hallman, Birch Run, MI (US); Wayne B. Thomas, Saginaw, MI (US); Shawn M. Barber, Bay City, MI (US); Matthew W. Mielke, Freeland, MI (US); Donald E. Lemke, Frankenmuth, MI (US); Kenneth G. Johnston, Freeland, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 1096 days.

(21) Appl. No.: 17/102,506

(22) Filed: Nov. 24, 2020

(65) Prior Publication Data

US 2022/0165471 A1 May 26, 2022

(51) Int. Cl.
*H01F 27/06* (2006.01)
*H01F 27/28* (2006.01)
*H01F 27/29* (2006.01)
*H01F 37/00* (2006.01)
*H05K 1/18* (2006.01)
*H05K 3/34* (2006.01)

(52) U.S. Cl.
CPC .......... *H01F 27/06* (2013.01); *H01F 27/292* (2013.01); *H01F 37/00* (2013.01); *H05K 1/181* (2013.01); *H05K 3/3426* (2013.01); *H01F 2027/065* (2013.01); *H01F 27/2895* (2013.01); *H05K 2201/10015* (2013.01); *H05K 2201/1003* (2013.01); *H05K 2201/10545* (2013.01); *H05K 2203/1484* (2013.01)

(58) Field of Classification Search
CPC ........ H01F 27/06; H01F 27/292; H01F 37/00; H01F 27/2895; H01F 2027/065; H05K 1/181; H05K 3/3426; H05K 2201/10015; H05K 2201/1003; H05K 2201/10545; H05K 2203/1484
See application file for complete search history.

(56) References Cited

U.S. PATENT DOCUMENTS

| | | | |
|---|---|---|---|
| 2001/0008044 A1* | 7/2001 | Machado | H01F 27/027 29/854 |
| 2002/0017976 A1* | 2/2002 | Okamoto | H01F 27/027 336/229 |
| 2002/0084881 A1* | 7/2002 | Kummel | H01F 41/127 336/200 |

(Continued)

*Primary Examiner* — Malcolm Barnes
(74) *Attorney, Agent, or Firm* — Dickinson Wright PLLC

(57) ABSTRACT

An inductor comprises a base having a top surface, a bottom surface, and at least one side surface. The top surface is spaced from the bottom surface. The at least one side surface connects the top surface to the bottom surface. A core is located on the top surface and coupled to the base. At least one coil extends helically about the core. The at least one coil has at least one end extending outwardly from said core. At least one lead is coupled to the at least one coil and extending outwardly from the base in a coplanar relationship with the bottom surface. A circuit card assembly including the inductor and a method of manufacturing the circuit card assembly are also disclosed herein.

18 Claims, 8 Drawing Sheets

(56) References Cited

U.S. PATENT DOCUMENTS

| | | | |
|---|---|---|---|
| 2006/0284716 A1* | 12/2006 | Yamaguchi | H01F 17/045 336/221 |
| 2011/0291783 A1* | 12/2011 | Yamada | H01F 27/292 336/192 |
| 2014/0092575 A1* | 4/2014 | Lee | H01F 5/04 336/65 |
| 2014/0211427 A1* | 7/2014 | Gilmartin | H01F 17/043 361/748 |
| 2015/0287511 A1* | 10/2015 | Furukawa | H01F 27/02 336/84 R |
| 2019/0027297 A1* | 1/2019 | Sasaki | H01F 27/2828 |
| 2021/0090787 A1* | 3/2021 | Sasaki | H01F 17/045 |
| 2021/0090793 A1* | 3/2021 | Sasaki | H01F 41/12 |
| 2022/0102050 A1* | 3/2022 | Monma | H01F 27/26 |

* cited by examiner

HIGH CURRENT SURFACE MOUNT TOROID INDUCTOR

FIELD OF THE INVENTION

The present disclosure relates to a printed circuit board and a method for manufacturing a circuit card assembly.

BACKGROUND

Inductors are passive electronic components that store energy in the form of a magnetic field. Every conductor has a certain amount of inductance associated therewith. In order to obtain higher values of inductance, the wire can be formed into a loop or coil. The amount of inductance attributable to a particular inductor device is generally proportional to the number of turns in the coil, the radius of the coil and the type of material around which the coil is wound.

Inductors that are located in integrated circuit (IC) packages are limited in their capabilities for supporting high current due to the limited real estate in IC packages. For example, as power electronics for high current applications such as ADAS EPS systems seek to occupy less space, the power inductor emerges as a large component that can be targeted for space savings. Conventionally, the inductors can be mounted or integrated into the header or connector. Alternatively, mounting methods such as through hole technology (THT) can be used to couple the inductors to the Printed Circuit Board ("PCB"). However, not all vehicle packaging environments can provide a cost-effective solution using the above techniques.

There are also a few undesirable issues for the above-described conventional methods. First, by mounting or integrating the inductors into the header or connector, the conventional method fixates the position of the inductors thereby restricting the amount of designs, i.e. different combination/arrangements of the components, available when populating components onto the PCB. Secondly, when utilizing the through hole technology to mount the inductors, the inductors also occupy areas on the backside of the PCB thereby reducing the amount of real estate available on the backside to populate the components. Accordingly, it would be desirable to provide an alternative design to the conventional inductors and a manufacturing process alternative to the conventional method for manufacturing a circuit card assembly.

SUMMARY

The present disclosure provides an inductor that can expand and contract at the same magnitude and rate as a printed circuit board. The present disclosure also provides a circuit card assembly having a reduced size which reduces manufacturing cost over time. The present disclosure also provides a method for manufacturing a circuit card assembly that has a low manufacturing cost and can be easily streamlined.

According to one aspect of the present disclosure, an inductor comprises a base having a top surface, a bottom surface, and at least one side surface. The top surface is spaced from the bottom surface. The at least one side surface connects the top surface to the bottom surface. A core is located on the top surface and coupled to the base. At least one coil extends helically about the core. The at least one coil has at least one end extending outwardly from said core. At least one lead is coupled to the at least one coil and extending outwardly from the base in a coplanar relationship with the bottom surface.

According to another aspect of the present disclosure, a circuit card assembly comprise a substrate having a first surface and a second surface. At least one component, located on the second surface and opposite of the inductor. The at least one component is coupled to the second surface of the substrate. An inductor is coupled to the first surface of the substrate, opposite the at least one component, without penetrating the substrate.

According to another aspect of the present disclosure, a method for manufacturing a circuit card assembly comprises a first step of providing a substrate, the substrate having a first surface and a second surface. The first surface and the second surface is opposite and spaced apart from one another. The method then proceeds with populating at least one component onto the second surface of the substrate to form a circuit card assembly. Next, the method proceeds with populating an inductor onto the first surface of the substrate of the circuit card assembly, opposite of the at least one component, without penetrating said substrate. Then, the method proceeds with curing the circuit card assembly including the inductor.

These and other advantages and features will become more apparent from the following description taken in conjunction with the drawings.

BRIEF DESCRIPTION OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Referring now to the Figures, where the invention will be described with reference to specific embodiments, without limiting same, an inductor 20 constructed according to an aspect of the present disclosure is generally shown in FIGS. 1-6.

Figure 1:
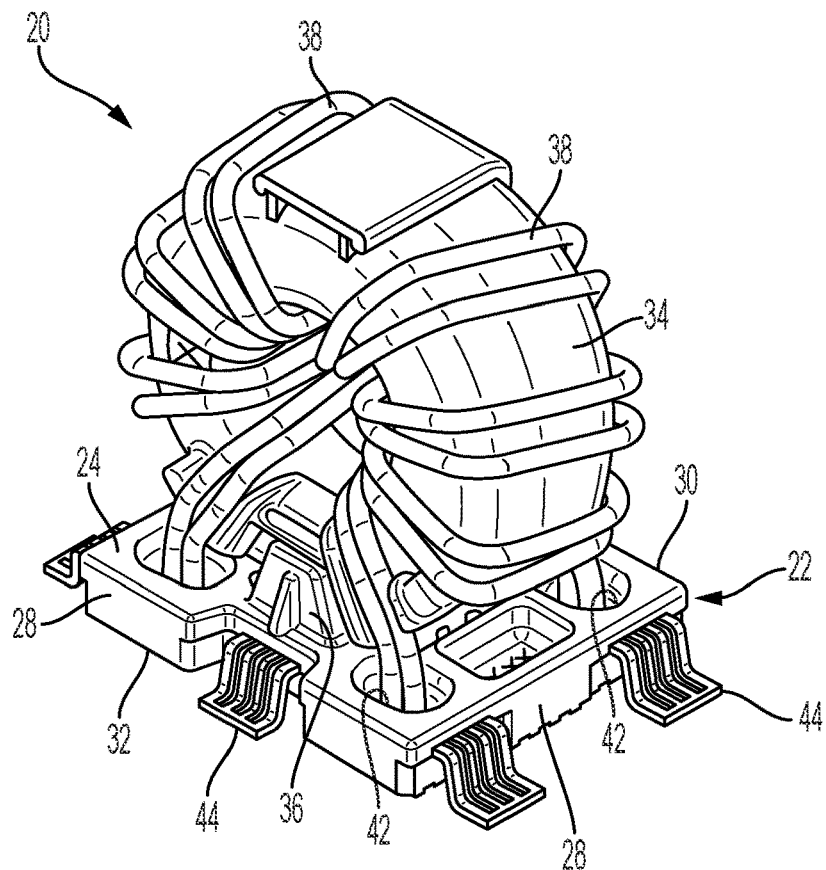
FIG. 1 is a perspective view of an inductor assembly according to an aspect of the present disclosure.

As shown in FIG. 1, the inductor 20 comprises a base 22. According to an aspect of the present disclosure, the base 22 can have a generally rectangular shape which includes a top surface 24, a bottom surface 26, and at least one side surface 28. The top surface 24 is opposite and spaced apart from the bottom surface 26. The at least one side surface 28 extends between the top surface 24 and the bottom surface 26 to join the top surface 24 with the bottom surface 26. According to an aspect of the present disclosure, the at least one side surface 28 can include a plurality of side surfaces 28 extending about a periphery 30 of the top surface 24 and a periphery 32 of the bottom surface 26 to connect the top surface 24 with the bottom surface 26. The base 22 can also have various different shapes such as but not limited to toroid, triangular, and trapezoidal shapes.

A core 34 is located on the top surface 24 of the base 22 and coupled to the base 22 for storing energy, creating impedance, and modulating the flow of current. A pair of support members 36, spaced apart from one another, extends outwardly from the top surface 24 of the base 22. The core 34 is sandwiched between the support members 36 to provide support to the core 34. Depending on circuit type and power requirements, there are many choices for core materials and even more options for core shape and size. For example, depending on different types of applications, the core 34 can be made from various material such as but not limited to silicon steel, powdered iron or nickel, and ferrites. Alternatively, the core 34 can also define a void. Each material can have its own unique magnetic properties such as the amount of energy can be stored, the amount of inductance the core can create, the amount of energy loss (due to hysteresis and eddy current losses), and stability factors due to temperature, current, and frequency changes.

The many different core materials used in the inductor 20 can be generally categorized as solid magnetic metallic, powder and ceramic, and air. Iron cores are manufactured either from a strip or tape of sheet steel that is wrapped around itself, i.e. washer-like. Powder cores are blends of powdered metals that are annealed, pressed, and sintered into their final core shape. Powdered metals commonly used for inductor cores include molybdenum permalloy, a nickel-iron-molybdenum blend, carbonyl iron, and various ferrite blends. There various benefits associated with using a powder cores. One such a benefit of powdered cores, particularly molybdenum permanent alloy cores, over solid cores is that they contain a uniform distribution of air gaps due to the granular nature of the raw material. This leads to fairly constant permeability and a fairly constant core loss in a wide variety of use. Powdered ferrite cores can achieve high electrical resistance and low eddy current losses. Powdered metal can also be altered by adding additional metal powders to the mix in order to achieve special core properties, such as extremely stable temperature characteristics.

At least one coil 38 extends helically about the core 34. The at least one coil 36 has at least one end 40 extending radially outwardly from the core 34. According to an aspect of the present disclosure, the at least one coil 38 can have a pair of ends 40 extending radially outwardly from the core 34. According to an aspect of the present disclosure, the at least one coil 38 can include a pair of coils, circumferentially spaced from each other, extending helically about the core 34. Each coil of the pair of coils can include a pair of ends 40 extending radially outwardly from the core 34. The core 34 can have a various shapes such as but not limited to a C-shape, a toroid shape, and a U-shape. According to an aspect of the present disclosure, the core 34 can have a generally toroid shape. This is because every portion of the core 34 can be used to wind upon and every portion of the core 34 can be covered by the winding. The magnetic field of the windings of the toroidal-shaped core is confined almost completely to the physical space of the winding, which means that the majority of the lines of force are found within the form of the toroidal-shaped core. Additionally, the flux density of the toroidal-shaped core 34 is essentially uniform throughout the entire electromagnetic path. Furthermore, the externally originating magnetic fields generally have little to no effect on toroidal-shaped core 34.

The top surface 24 of the base 22 defines at least one orifice 42 for receiving the at least one end 40 of the least one coil 38. According to an aspect of the present disclosure, the at least one orifice 42 can include a plurality of four orifices with each orifice of the plurality of four orifices receiving an end 40 of the pair of ends of the at least one coil 38. Moreover, each orifice 42 of the plurality of four orifices extends from the top surface 24 toward the bottom surface 26. Each orifice 42 terminates prior to the bottom surface 26. At least one lead 44 couples to the at least one coil 38 extending outwardly from the base 22 in a coplanar relationship with the bottom surface 26.

Figure 2:
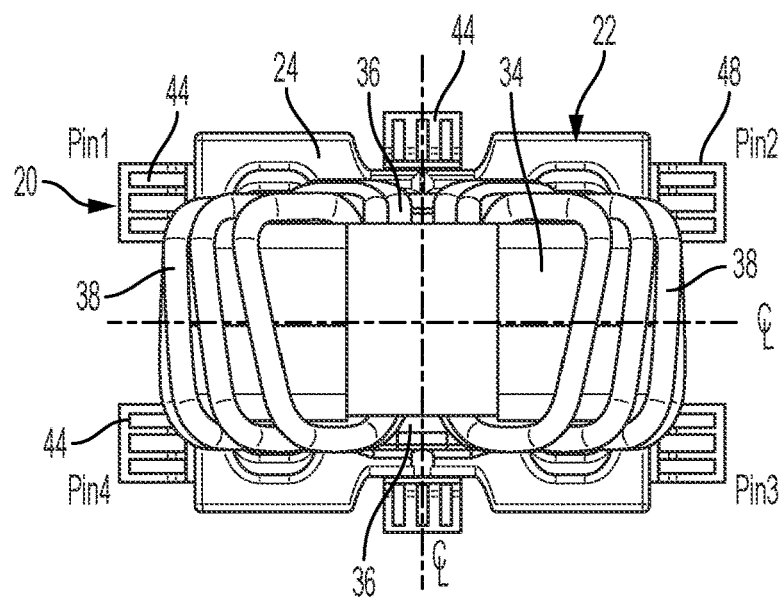
FIG. 2 is a top view of the inductor assembly according to an aspect of the present disclosure.
Figure 3:
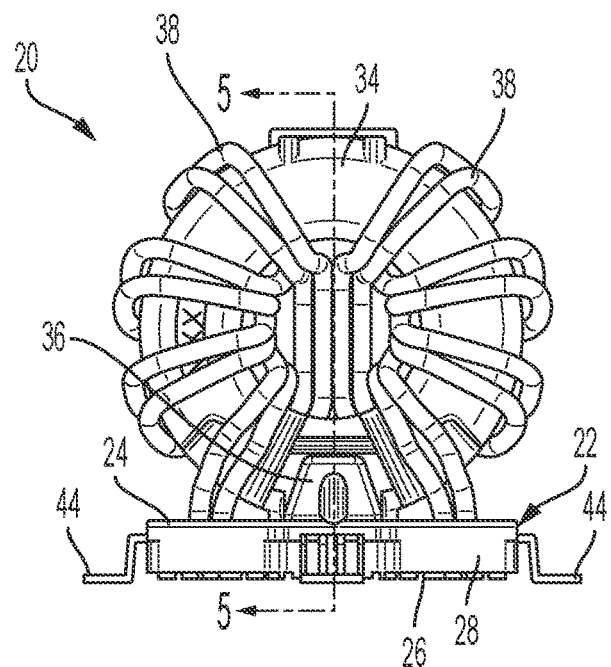
FIG. 3 is a front view of the inductor assembly according to an aspect of the present disclosure.
Figure 4:
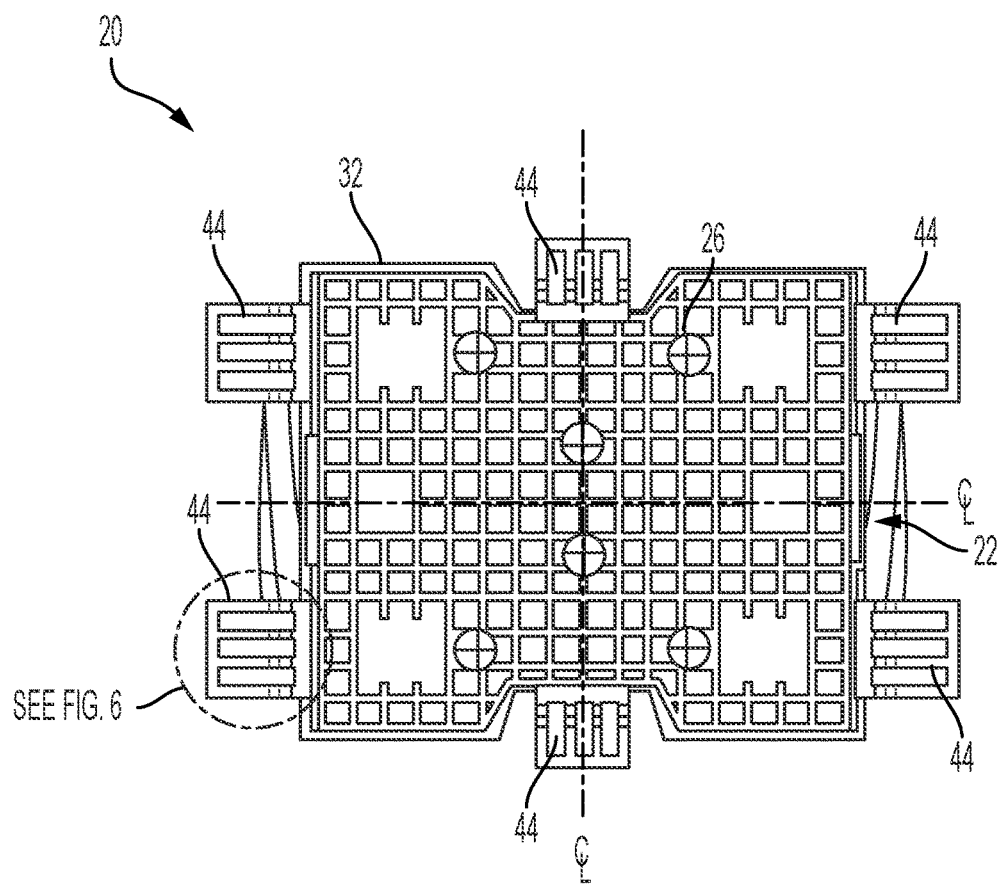
FIG. 4 is a bottom view of the inductor assembly according to an aspect of the present disclosure.

According to an aspect of the present disclosure, the at least one lead 44 can include a plurality of leads. For example, as best shown in FIGS. 2 and 4, a length of the base 22 can include a plurality of three leads 44, spaced apart from one another, extending perpendicularly outwardly from the length of the base 22. Additionally, a width of the base 22 can include two sets of leads spaced apart from one another and extending perpendicularly outwardly from the width of the base 22. Each set of the two sets of leads can include a plurality of three leads 44 spaced apart from one another. According to an aspect of the present disclosure, the lead spacing of the inductor 20 can be 32 mm along the length of the base 22 and 22.4 mm along the width of the base 22. Accordingly, an initial Finite Element Analysis (FEA) revealed that there was no strain mitigation for the base 22 when coupled to a circuit card assembly and the strain, when coupled to a circuit card assembly, was as high as 27%. In other words, the strain of the inductor 20 is the same as the strain of a 1206 style resistor/capacitor. In summary, this arrangement can cause the base 22 of the inductor 20 to expand and contract at the same magnitude and rate as a PCB. By controlling the expansion, the large $\Delta L/L$ of the base 22 of the inductor 22 can be neutralized by bonding the base 22 of the inductor 20 to the PCB.

Figure 5:
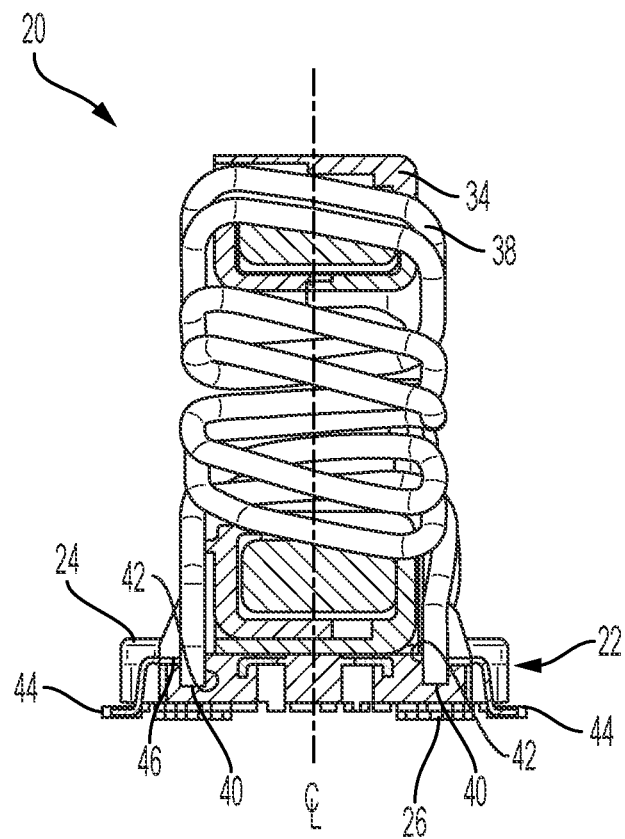
FIG. 5 is a cross-sectional view of the inductor assembly along the lines 5-5 in FIG. 3 according to an aspect of the present disclosure.
Figure 6:
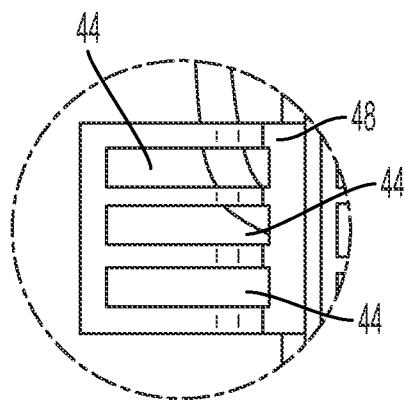
FIG. 6 is an enlarged view of a tie bar of the inductor assembly according to an aspect of the present disclosure.
Figure 7:
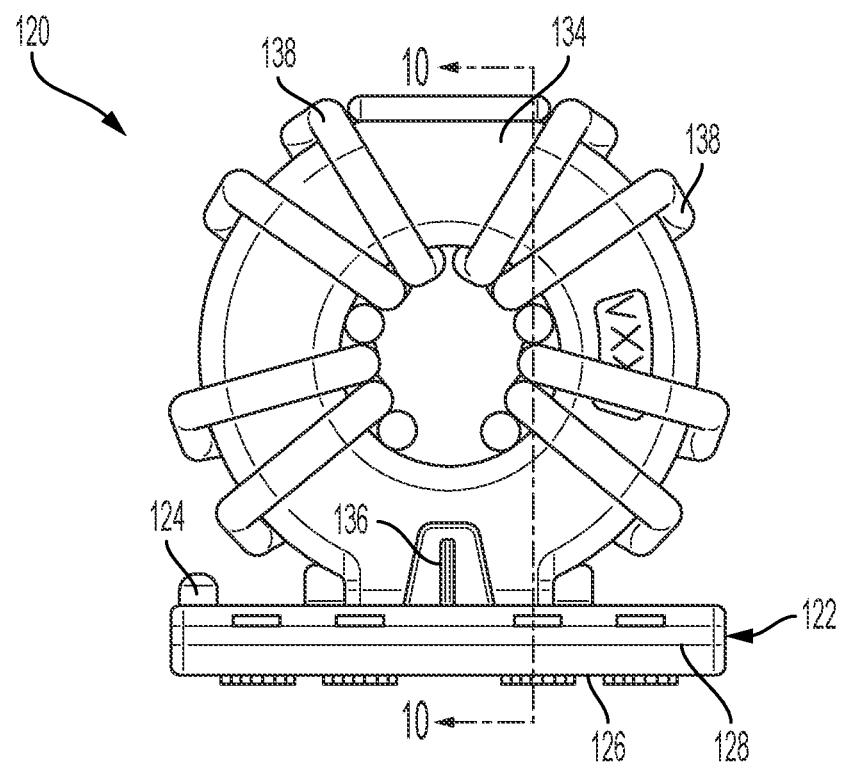
FIG. 7 is a front view of an inductor assembly according to another aspect of the present disclosure.
Figure 8:
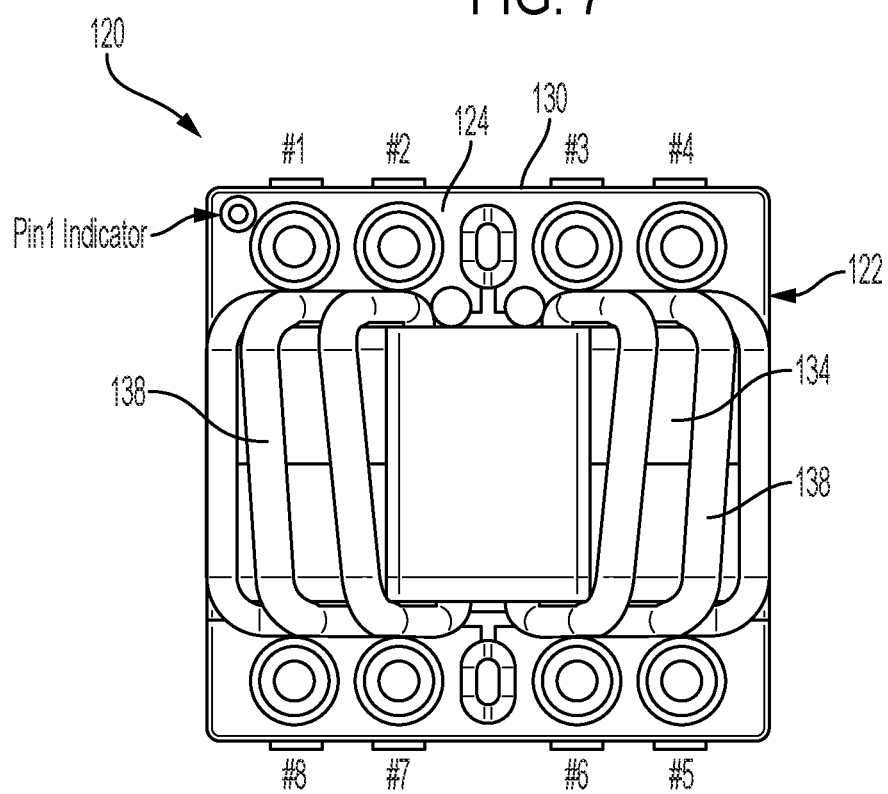
FIG. 8 is a top view of the inductor assembly according to another aspect of the present disclosure.
Figure 9:
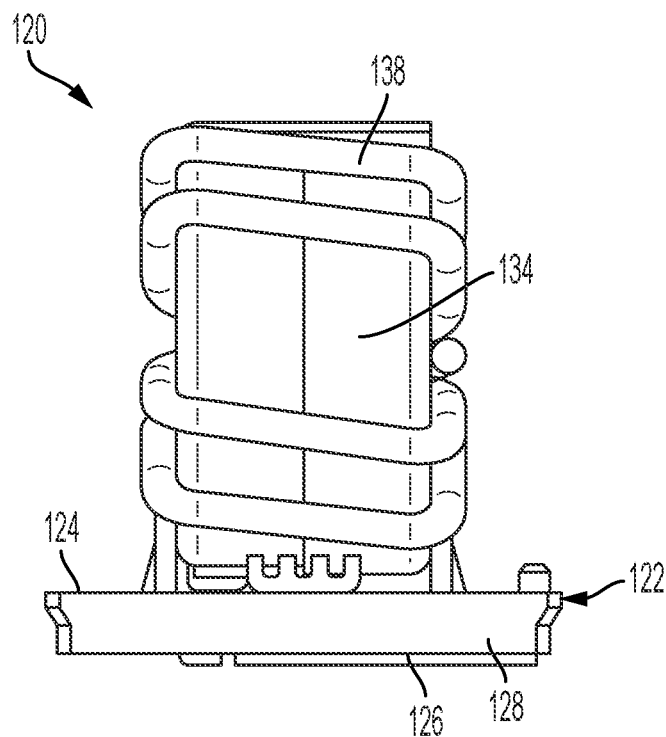
FIG. 9 is a side view of the inductor assembly according to another aspect of the present disclosure.
Figure 10:
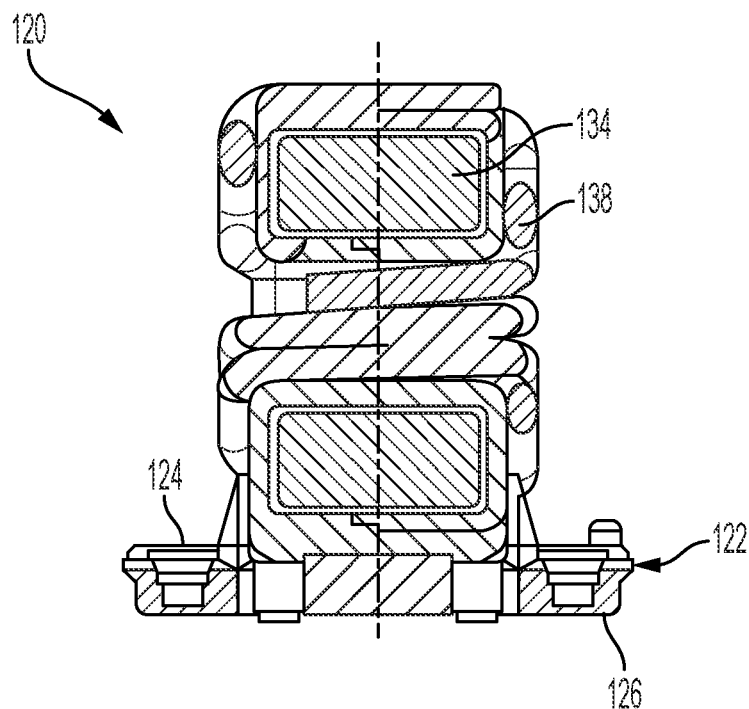
FIG. 10 is a cross-sectional view of the inductor assembly along the lines 10-10 in FIG. 3 according to an aspect of the present disclosure.

As best shown in FIG. 5, each lead of the plurality of three leads 44 can have a generally S-shape with one end 46 being located in the base 22 coupled to the at least one coil 38. A tie bar 48, located adjacent to the plurality of leads 44, is coupled to the base 22 for maintaining the coplanar relationship between adjacent leads of the plurality of leads 44 and establishing a robust solder joint for coupling the inductor 20 to a substrate of a circuit card assembly. In other words, while the primary function of the tie bar 48 is to maintain coplanarity of the bifurcation of the plurality of three leads 44 to help achieve a consistent IPC class 3 solder joint, the tie bar 48 also serves to create a very robust solder joint which has a broad toe fillet along a face of the tie bar 48 and two distinct heel fillet areas. The first heel fillet area can be located where the tie bar 48 meets the base 22. The second heel fillet area can be located on the component side of the tie bar 48. These design elements are key to surviving thermal cycle fatigue with a terminal which is 0.40 mm thick to handle the high current required. In other words, dimensions of the terminal are designed to minimize the resistance of the inductor 20 and therefore, minimizes the self-heating effect of the inductor 20.

FIGS. 7-11 show an inductor 120 constructed according to another aspect of the present disclosure. The inductor 120 comprises a base 122. The base 122 can have a generally square or rectangular shape including a top surface 124, a bottom surface 126, and at least one side surfaces 128. The top surface 124 is opposite and spaced apart from the bottom surface 126. The at least one side surface 128 extends between the top surface 124 and the bottom surface 126 to join the top surface 124 with the bottom surface 126. According to an aspect of the present disclosure, the at least one side surface 128 can include a plurality of side surfaces 128 extending about a periphery 130 of the top surface 124 and a periphery 132 of the bottom surface 126 to connect the top surface 124 with the bottom surface 126. The base 122 can also have various different shapes such as but not limited to toroid, triangular, and trapezoidal shapes.

A core 134 is located on the top surface 124 of the base 122 and coupled to the base 122 for storing energy, creating impedance, and modulating the flow of current. A pair of support members 136, spaced apart from one another, extends outwardly from the top surface 124 of the base 122. The core 134 is sandwiched between the support members 136 to provide support to the core 134.

At least one coil 138 extending helically about the core 134. The at least one coil 136 has at least one end 140 extending radially outwardly from the core 134. According to an aspect of the present disclosure, the at least one coil 138 can include a pair of ends 140 extending radially outwardly from the core 134. According to an aspect of the present disclosure, the at least one coil 138 can include a pair of coils, circumferentially spaced from one another, extending helically about the core 134. Each coil of the pair of coils 138 can include a pair of ends 140 extending radially outwardly from the core 134. According to an aspect of the present disclosure, the core 134 can have a generally toroid shape.

The top surface 124 of the base 122 defines at least one orifice 142 for receiving the at least one end 140 of the least one coil 138. According to an aspect of the present disclosure, the at least one orifice 142 can include a plurality of four orifices with each orifice of the plurality of four orifices receiving an end 140 of the pair of ends of the at least one coil 138. Moreover, each orifice 142 of the plurality of four orifices extends from the top surface 124 toward the bottom surface 126. Each orifice 142 terminates prior to the bottom surface 126. At least one lead 144 couples to the at least one coil 138 extending outwardly from the base 122 in a coplanar relationship with the bottom surface 126.

Figure 11:
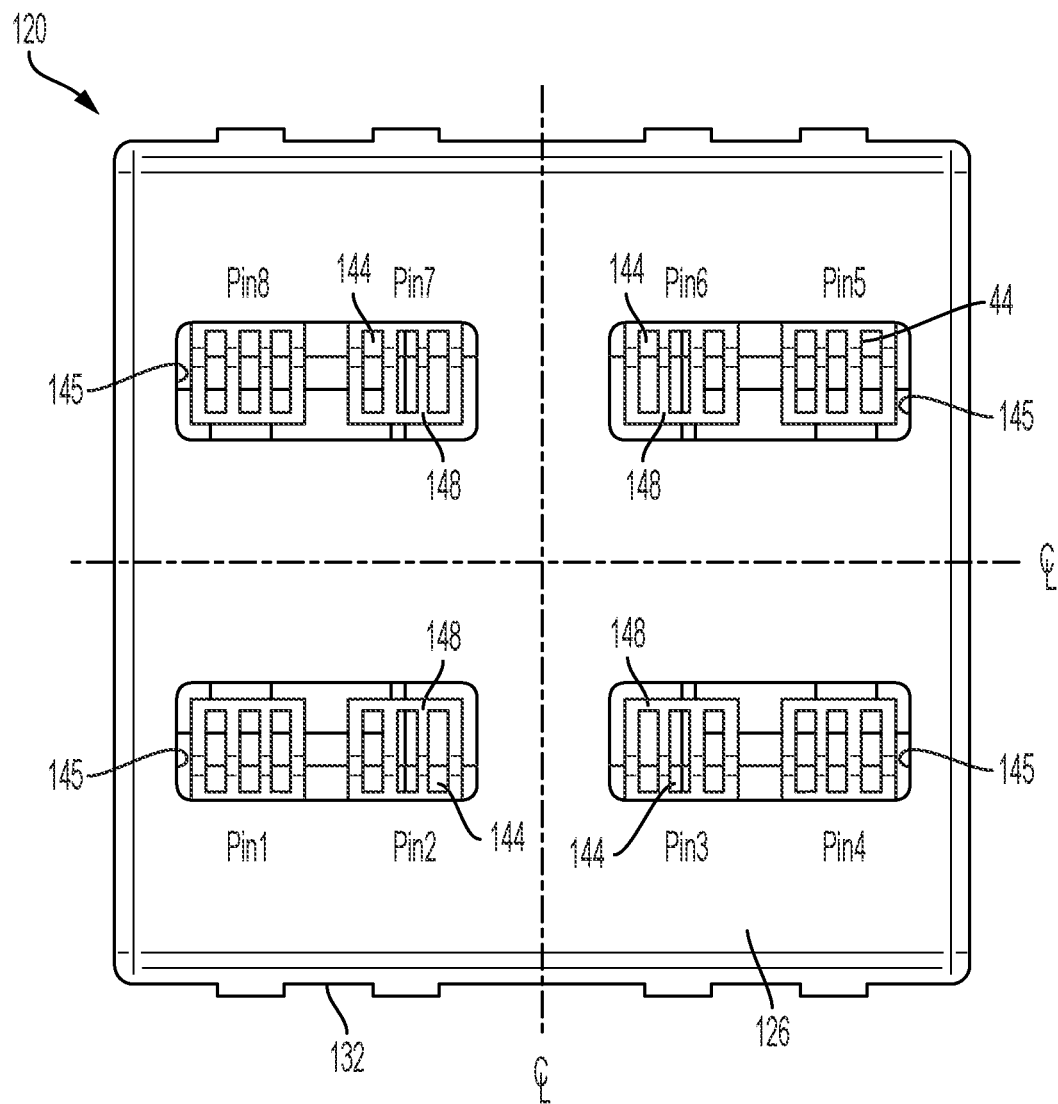
FIG. 11 is a bottom view of the inductor assembly according to another aspect of the present disclosure.

As best shown in FIG. 11, the bottom surface 126 of the base 122 can define at least one recess 145. According to an aspect of the present disclosure, the at least one recess 145 can include a plurality of four recesses spaced apart from one another. Each recess of the plurality of recesses extends from the bottom surface 126 to the top surface 128. The at least one lead 144 is located in the recess 145 and extends outwardly from the recess in a coplanar relationship with the bottom surface 126. According to an aspect of the present disclosure, each recess 145 can include two sets of leads 144 located therein. Each set of leads can include a plurality of three leads spaced apart from one another. In this arrangement, when coupled to a substrate of a circuit card assembly, the solder joints are enclosed in the recess 145 thereby allowing for a close contact between the substrate and the inductor 120. Moreover, this arrangement prevents the solder joints from being exposed to exterior environment and therefore, preventing corrosion caused by the exposure.

Each lead of the plurality of three leads 144 can have a generally S-shape with one end 146 being located in the base 122 coupled to the at least one coil 138. A tie bar 148, located in the at least one recess 145 and adjacent to the plurality of leads 144, is coupled to the base 122 for maintaining the coplanar relationship between adjacent leads of the plurality of leads 144 and establishing a robust solder joint for coupling the inductor 120 to a substrate of a circuit card assembly.

Figure 12:
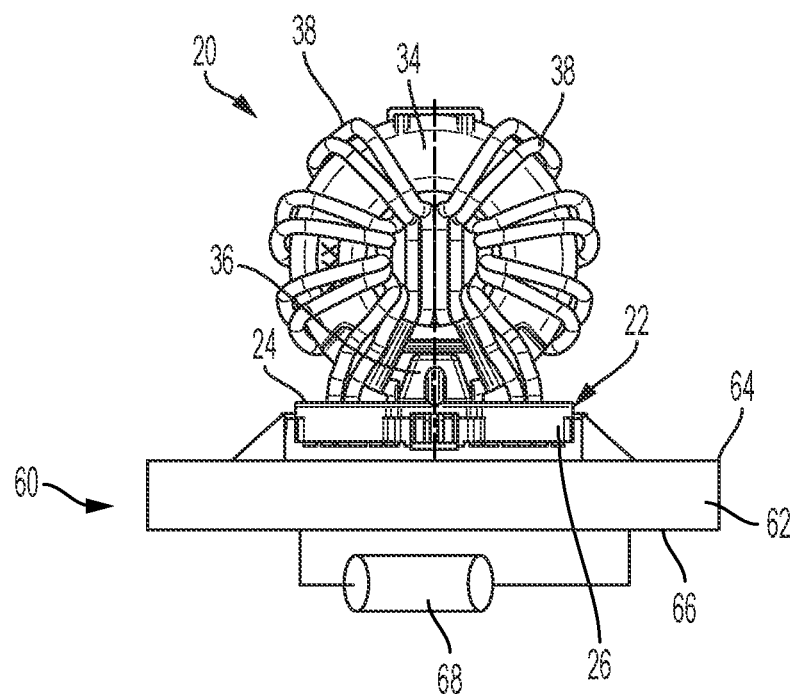
FIG. 12 is a side view of a circuit card assembly including the inductor according to an aspect of the present disclosure.
Figure 13:
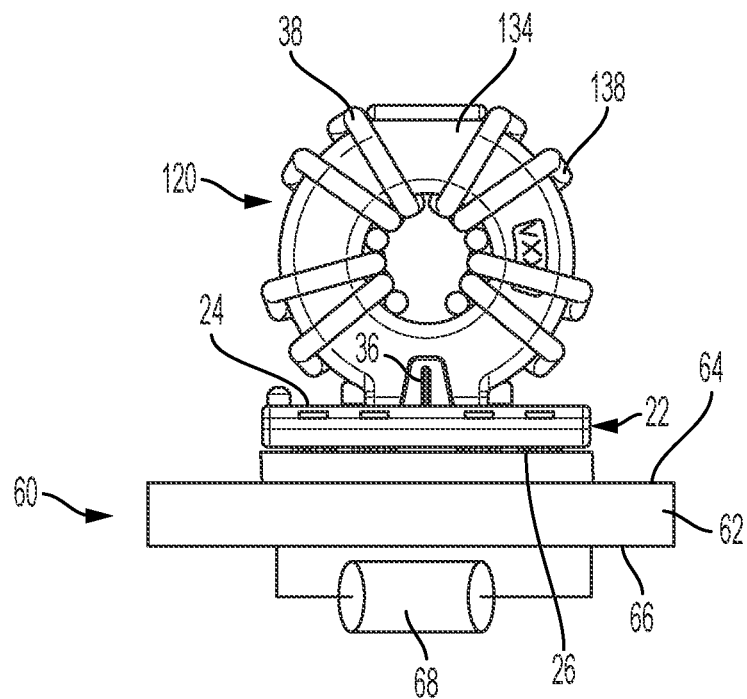
FIG. 13 is a side view of a circuit card assembly including the inductor according to another aspect of the present disclosure.

It is another aspect of the present disclosure to provide a circuit card assembly 60 ("CCA"). The circuit card assembly 60, as best illustrated in FIGS. 12 and 13, comprises a substrate 62 having a first surface 64 and a second surface 66. According to an aspect of the present disclosure, the substrate 62 can be a printed circuit board ("PCB"). At least one component 68 is coupled to the second surface of the substrate 62. According to an aspect of the present disclosure, the at least one component 68 may include, but not limited to capacitors and processors. An inductor 20, 120, as described above, is coupled to the first surface 64 of the substrate 62, opposite the at least one component 68. The inductor 20, 120 is coupled to, without penetrating, the substrate 62. In other words, when coupled to the substrate 62, the inductor 20, 120 only occupies space on one side of the CCA or printed wiring board assembly (PWBA).

According to an aspect of the present disclosure, to bond the inductor 20, 120 to the substrate 62 an epoxy adhesive with an ultimate tensile strength of 8,000 psi and modulus of elasticity of 800,000 psi can be used. The high temperature operation environment for the epoxy adhesive is rated for use up to 177° C. Additionally, the bottom surface of the base of the inductor can have has a "waffle bottom," i.e. including a plurality of indentations 70 (as best as shown in FIG. 4). The indentations 70 can provide additional surface area to increase bond strength between the inductor 20, 120 and the substrate 62 and provide additional contact area for heat transfer. This prevents the temperature of the epoxy adhesive from going into thermal run-away during curing due to exothermic nature of the curing process. Additionally, during operation, the increased heat transfer area along with a thin bond line helps to cool the part faster during high temperature operation.

In a conventional inductor, to couple to the inductor to the substrate of the CCA, leads of the inductor protrude through the substrate which causes the inductor to occupy spaces on both sides of the substrate. For example, the conventional inductor, which is present on at least 60 million CCAs in the field, occupies the second surface of the substrate, which is approximately 340 mm². The inductor 20, 120 of the present disclosure is able to free up the space on the second surface which can make room for approximately 85 more 0603 type resistor or capacitors. This also reduces the size of the substrate and the CCA which provides a significant cost savings over time.

Figure 14:
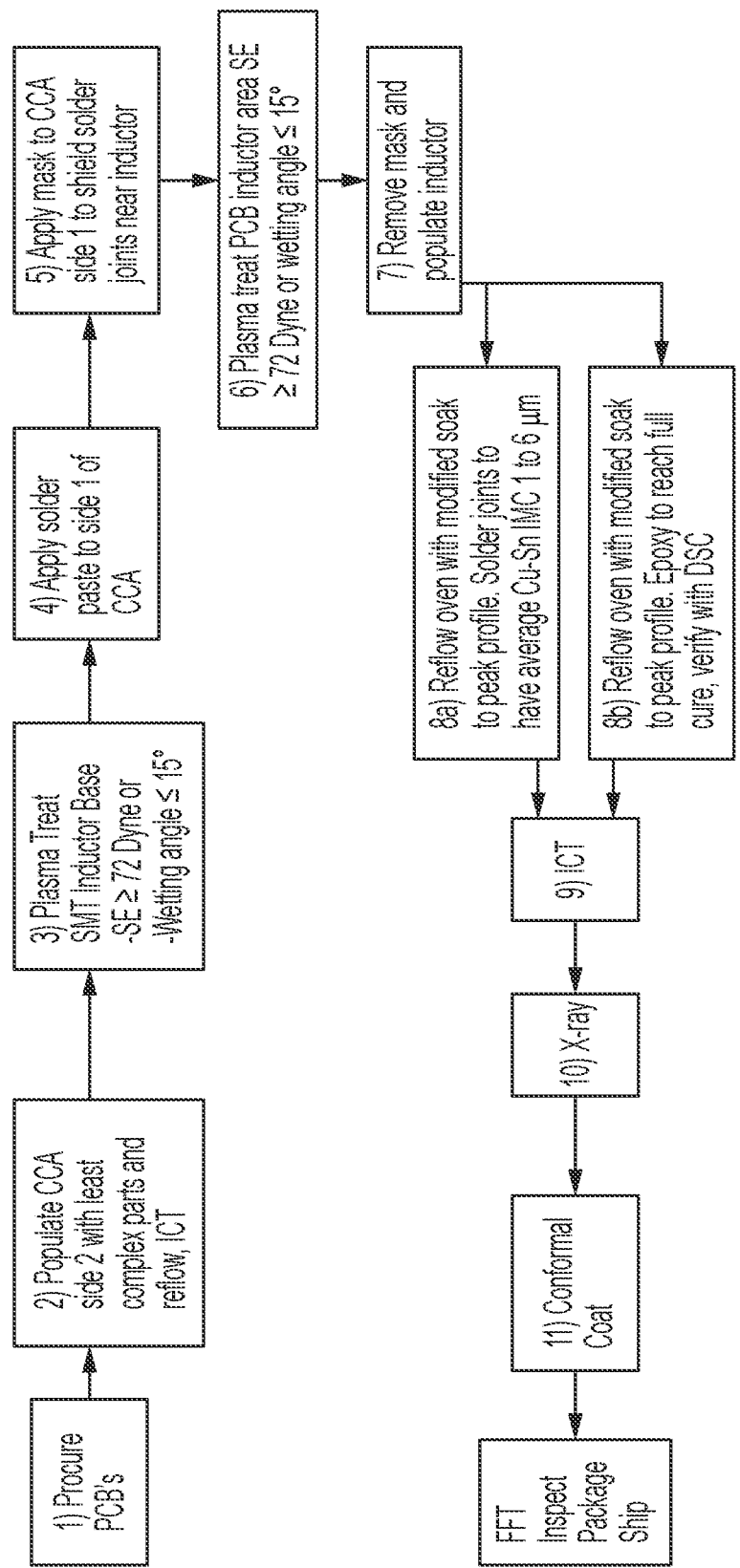
FIG. 14 is a schematic view of a manufacturing process for a circuit card assembly according to an aspect of the present disclosure.

It is a further aspect of the present disclosure to provide a method for manufacturing a circuit card assembly. As best illustrated in FIG. 14, the method comprises a first step of providing a substrate 62. The substrate 62 has a first surface 64 and a second surface 66. The first surface 64 and the second surface 66 are opposite, and spaced, from one another. According to an aspect of the present disclosure, the step of providing the substrate 62 can be defined as providing a printed circuit board.

The method then proceeds with a step of populating at least one component 68 onto the second surface 66 of the substrate 62 to form a circuit card assembly ("CCA"). The at least one component 68 can include, but is not limited to, capacitors and processors. The at least one component 68 can be populated onto the substrate 62 by subjecting the substrate 62 including the at least one component 68 via a reflow soldering process. After populating the at least one component 68, in-circuit test ("ICT") can be conducted on the second surface 66 of the substrate 22 including the at least one component to identify any potential defects.

After populating the at least one component 68, the method then proceeds with populating an inductor 20, 120 onto the first surface 64 of the substrate 62 without penetrating the substrate 62. The step of populating the inductor 20, 120 can include steps of providing an inductor 20, 120 and cleaning the inductor 20, 120. The step of cleaning the inductor 20, 120 can be conducted by plasma treating the inductor 20, 120 using a plasma treating system. The plasma treating system operates at zero volts such that surface energy is greater than or equal to 72 dynes or a wetting angle measure with a Goniometer is less than or equal to 15°. The inductor 20, 120 having the surface energy being greater than or equal to 72 dynes indicates a high surface tension of the inductor 20, 120 which prevents liquid penetration. Additionally, the wetting angle α of the inductor 20, 120 being less than or equal to 15° indicates the inductor 20, 120 being wettable, thereby facilitating formation of a uniform layer on the surface of the inductor 20, 120.

The next step of the method is applying a solder paste to the first surface 64 of the substrate 62. According to an aspect of the present invention, the solder paste can contain copper and tin. After applying the solder paste, an epoxy adhesive can be applied to the bottom surface 26, 126 of the inductor 20, 120. After applying the soldering paste and the epoxy adhesive, the method proceeds with depositing the inductor 20, 120 including the epoxy adhesive onto the first surface 64 of the substrate 62. The method can include a step of covering a portion of the first surface 64 of the substrate 62 including the solder paste. The step of covering can be defined as dispensing a masking material onto the portion of the first surface 64 of the substrate 62 including the solder paste to cover and protect adjacent solder joints. The masking material may be cured via ultraviolet light to form a protective layer over the portion of the surface of the substrate 62.

Then, the method proceeds with a step of cleaning the substrate 62 including the inductor 20, 120. The step of cleaning can include a step of plasma treating the substrate 62 including the inductor 20, 120 using a plasma treating system. During the plasma treating step, the plasma treating system can operate at zero volts such that surface energy of the substrate 62 including the solder paste is greater than or equal to 72 dynes or a wetting angle measured with a Goniometer is less than or equal to 15°. The substrate 62 having the surface energy being greater than or equal to 72 dynes indicates a high surface tension of the substrate 62, which prevents liquid penetration. Additionally, the wetting angle α of the substrate 62 being less than or equal to 15° indicates the substrate 62 being wettable, thereby facilitating formation of a uniform layer on the surface of the substrate 62. The plasma beam of the plasma treating system is typically positioned 15 mm from the treated surface and is applied in a short enough period such that the organic solderability preservative finish on the substrate isn't degraded. In cases which it is desired to apply solder paste prior to plasma treating, a mask which shields the paste deposits can be used.

The masking material can then be removed from the first surface 64 of the substrate 62. Then, the inductor 20, 120 is deposited onto the first surface 64 of the substrate 62. Next, the method proceeds with a step of curing the substrate 62 including the inductor 20, 120. According to an aspect of the present disclosure, the curing step can be conducted by using a reflow oven. During the curing step, solder joints are formed having an average Cu—Sn intermetallic compound of between 1 μm to 6 μm. At the same time, the epoxy adhesive is also fully cured to bond the inductor 20, 120 to the first surface 64 of the substrate 62. This attachment method also minimizes contact resistance between the inductor and over the entire lifetime of the component.

After curing the substrate 62 including the inductor 20, 120, the method can proceed with a step of examining the substrate 62 including the inductor 20, 120 to identify any potential abnormalities. The step examining process can comprise a step of conducting an in-circuit test ("ICT") to check for shorts, opens, resistance, capacitance, and other basic quantities which will show whether the circuit card assembly was fabricated correctly. Additionally, the step examining process can further comprise a step of conducting an X-ray inspection to check for hidden defects such as, but not limited to, solder voids (including measurements) and solder abnormalities like non-wetting solder balls.

After examining the substrate 62, the method proceeds with a step of applying a conformal coating to the substrate 62 including the inductor 20, 120. Conformal coating is a specialty polymeric film forming product that protects the circuit card assemblies, components, and other electronic devices from adverse environmental conditions. These coatings 'conform' to the irregular landscape of the PCB providing increased dielectric resistance, operational integrity, and protection from corrosive atmospheres, humidity, heat, fungus, and airborne contamination such as dirt and dust. In other words, the conformal coatings provide resistance to environmental exposure, which increases the durability of the circuit card assembly while still keeping application and repair processes practical. According to an aspect of the present disclosure, the conformal coatings can be made from materials such as but not limited to acrylic resin, silicone resin, and polyurethane resin.

While the invention has been described in detail in connection with only a limited number of embodiments, it can be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. An inductor comprising:
   a base having a top surface, a bottom surface, and at least one side surface, said top surface being spaced from said bottom surface, said at least one side surface connecting said top surface to said bottom surface;
a core located on said top surface, said core extending beyond said top surface in a direction away from said bottom surface, and operatively coupled to said base;
at least one coil extending helically about said core, said at least one coil having at least one end extending outwardly from said core; and
at least one lead operatively coupled to said at least one coil and extending outwardly from said base in a coplanar relationship with said bottom surface, wherein said bottom surface defines at least one recess, said at least one lead being located in said recess and extending outwardly from said bottom surface in said coplanar relationship with said bottom surface.

2. The inductor according to claim 1, wherein said at least one lead has a generally S-shape with one end of said at least one lead being located in said base and operatively coupled to said at least one coil.

3. The inductor according to claim 1, wherein said bottom surface defines a plurality of indentations extending toward said top surface for facilitating bonding said base to a substrate of a circuit card assembly.

4. An inductor comprising:
a base having a top surface, a bottom surface, and at least one side surface, said top surface being spaced from said bottom surface, said at least one side surface connecting said top surface to said bottom surface;
a core located on said top surface, said core extending beyond said top surface in a direction away from said bottom surface, and operatively coupled to said base;
at least one coil extending helically about said core, said at least one coil having at least one end extending outwardly from said core; and
at least one lead operatively coupled to said at least one coil and extending outwardly from said base in a coplanar relationship with said bottom surface, wherein said at least one side surface includes a plurality of side surfaces and each side surface of said plurality of side surface includes said at least one lead, and said at least one lead extends radially outwardly from said base in said coplanar relationship with said bottom surface.

5. The inductor according to claim 4, wherein said at least one lead has a generally S-shape with one end of said at least one lead being located in said base and operatively coupled to said at least one coil.

6. The inductor according to claim 4, wherein said bottom surface defines a plurality of indentations extending toward said top surface for facilitating bonding said base to a substrate of a circuit card assembly.

7. An inductor comprising:
a base having a top surface, a bottom surface, and at least one side surface, said top surface being spaced from said bottom surface, said at least one side surface connecting said top surface to said bottom surface;
 a core located on said top surface, said core extending beyond said top surface in a direction away from said bottom surface, and operatively coupled to said base;
 at least one coil extending helically about said core, said at least one coil having at least one end extending outwardly from said core; and
 at least one lead operatively coupled to said at least one coil and extending outwardly from said base in a coplanar relationship with said bottom surface, wherein said at least one lead includes a plurality of leads disposed in a coplanar relationship relative to one another; and
 a tie bar located adjacent to said plurality of leads, operatively coupled to said base for maintaining said coplanar relationship between adjacent leads of said plurality of leads and establishing a robust solder joint for coupling the inductor to a substrate.

8. The inductor according to claim 7, wherein said tie bar is operatively coupled to said at least one lead to provide support to said lead.

9. A circuit card assembly comprising:
a substrate having a first surface and a second surface;
at least one component located on and operatively coupled to, said second surface of said substrate; and
an inductor operatively coupled to said first surface of said substrate, located on said first surface and opposite said at least one component, without penetrating said substrate, wherein said inductor extends beyond said substrate in a direction away from said first surface of said substrate, wherein said inductor comprises:
a base having a top surface, a bottom surface, and at least one side surface, said top surface being spaced from said bottom surface, said at least one side surface connecting said top surface to said bottom surface;
a core located on said top surface and operatively coupled to said base;
at least one coil extending helically about said core, said at least one coil having at least one end extending outwardly from said core; and
at least one lead operatively coupled to said at least one coil and extending outwardly from said base in a coplanar relationship with said bottom surface,
wherein said bottom surface defines at least one recess and said at least one lead being located in said recess and extending outwardly from said recess in said coplanar relationship with said bottom surface.

10. The circuit card assembly according to claim 9, wherein said at least one side surface includes a plurality of side surfaces and each side surface of said plurality of side surface includes said at least one lead, and said at least one lead extends radially outwardly from said base in said coplanar relationship with said bottom surface.

11. The circuit card assembly according to claim 9, wherein said at least one lead has a generally S-shape with one end of said at least one lead being located in said base and operatively coupled to said at least one coil.

12. The inductor according to claim 9, wherein said at least one lead includes a plurality of leads disposed in a coplanar relationship relative to one another.

13. The inductor according to claim 12, further comprising a tie bar located adjacent to said plurality of leads, operatively coupled to said base for maintaining said coplanar relationship between adjacent leads of said plurality of leads and establishing a robust solder joint for coupling the inductor to a substrate.

14. A circuit card assembly comprising:
a substrate having a first surface and a second surface;
at least one component located on and operatively coupled to, said second surface of said substrate; and
an inductor operatively coupled to said first surface of said substrate, located on said first surface and opposite said at least one component, without penetrating said substrate, wherein said inductor extends beyond said substrate in a direction away from said first surface of said substrate, wherein said inductor comprises:
a base having a top surface, a bottom surface, and at least one side surface, said top surface being spaced from said bottom surface, said at least one side surface connecting said top surface to said bottom surface;
a core located on said top surface and operatively coupled to said base;
at least one coil extending helically about said core, said at least one coil having at least one end extending outwardly from said core; and
at least one lead operatively coupled to said at least one coil and extending outwardly from said base in a coplanar relationship with said bottom surface, wherein said bottom surface defines a plurality of indentations extending toward said top surface for facilitating bonding said base to a substrate of a circuit card assembly.

15. The circuit card assembly according to claim 14, wherein said at least one side surface includes a plurality of side surfaces and each side surface of said plurality of side surface includes said at least one lead, and said at least one lead extends radially outwardly from said base in said coplanar relationship with said bottom surface.

16. The circuit card assembly according to claim 14, wherein said at least one lead has a generally S-shape with one end of said at least one lead being located in said base and operatively coupled to said at least one coil.

17. The inductor according to claim 14, wherein said at least one lead includes a plurality of leads disposed in a coplanar relationship relative to one another.

18. The inductor according to claim 17, further comprising a tie bar located adjacent to said plurality of leads, operatively coupled to said base for maintaining said coplanar relationship between adjacent leads of said plurality of leads and establishing a robust solder joint for coupling the inductor to a substrate.

* * * * *